US010497441B2

(12) United States Patent
Lesartre

(10) Patent No.: US 10,497,441 B2
(45) Date of Patent: Dec. 3, 2019

(54) DETERMINING FIRST WRITE STRENGTH

(71) Applicant: HEWLETT PACKARD ENTERPRISE DEVELOPMENT LP, Houston, TX (US)

(72) Inventor: Gregg B Lesartre, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 9 days.

(21) Appl. No.: 15/744,056

(22) PCT Filed: Jul. 14, 2015

(86) PCT No.: PCT/US2015/040287
§ 371 (c)(1),
(2) Date: Jan. 11, 2018

(87) PCT Pub. No.: WO2017/010991
PCT Pub. Date: Jan. 19, 2017

(65) Prior Publication Data
US 2018/0204617 A1    Jul. 19, 2018

(51) Int. Cl.
*G11C 11/00* (2006.01)
*G11C 13/00* (2006.01)

(52) U.S. Cl.
CPC ........ *G11C 13/0069* (2013.01); *G11C 13/004* (2013.01); *G11C 13/0023* (2013.01); *G11C 13/0064* (2013.01); *G11C 13/0004* (2013.01); *G11C 13/0007* (2013.01); *G11C 2013/009* (2013.01); *G11C 2013/0045* (2013.01); *G11C 2013/0076* (2013.01);

(Continued)

(58) Field of Classification Search
CPC ............ G11C 13/0069; G11C 13/0004; G11C 13/0007; G11C 13/0023
USPC ....................................................... 365/148
See application file for complete search history.

(56) References Cited

U.S. PATENT DOCUMENTS

| 7,093,094 B2 | 8/2006 | Cismas |
| 7,433,226 B2 | 10/2008 | Lung |
| 7,518,904 B2 | 4/2009 | Dodge et al. |

(Continued)

FOREIGN PATENT DOCUMENTS

| WO | WO-2012006160 | 1/2012 |
| WO | WO-2014107335 A1 | 7/2014 |
| WO | WO-2016122627 | 8/2016 |

OTHER PUBLICATIONS

Chang, K.K.-W., et al., Improving DRAM Performance by Parallelizing Refreshes with Accesses [online], Jan. 17, 2014, Retrieved Dec. 18, 2014, 12 pages.

(Continued)

*Primary Examiner* — Huan Hoang
*Assistant Examiner* — Minh Dinh
(74) *Attorney, Agent, or Firm* — Hewlett Packard Enterprise Patent Department

(57) ABSTRACT

Example implementations relate to writing a desired memory value to a target memory element in a cross-point array of memory elements. For example, a desired memory value for the target memory element may be received, and a sneak current measurement for the target memory element may be received. A first write strength for writing the desired memory value to the target memory element may be determined based on the sneak current measurement.

20 Claims, 7 Drawing Sheets

(52) U.S. Cl.
CPC ............... *G11C 2013/0078* (2013.01); *G11C 2013/0092* (2013.01); *G11C 2213/15* (2013.01); *G11C 2213/77* (2013.01)

(56) References Cited

U.S. PATENT DOCUMENTS

| | | |
|---|---|---|
| 7,577,031 B2 | 8/2009 | Sekar et al. |
| 7,991,921 B2 | 8/2011 | Fischer |
| 8,004,884 B2 | 8/2011 | Franceschini |
| 8,134,866 B2 | 3/2012 | Bae et al. |
| 8,559,209 B2 | 10/2013 | Siau |
| 2005/0195647 A1 | 9/2005 | Perner |
| 2005/0201173 A1 | 9/2005 | Sharma et al. |
| 2008/0144357 A1 | 6/2008 | Siau et al. |
| 2012/0182815 A1 | 7/2012 | Joen et al. |
| 2012/0243294 A1 | 9/2012 | Kaneko et al. |
| 2013/0148406 A1 | 6/2013 | Shimakawa et al. |
| 2013/0185527 A1 | 7/2013 | Puckett et al. |
| 2013/0343114 A1 | 12/2013 | Carter |
| 2014/0112056 A1* | 4/2014 | Tsuji ................. G11C 8/08 365/148 |
| 2014/0133211 A1 | 5/2014 | Nazarian et al. |
| 2014/0149824 A1 | 5/2014 | Ordentlich et al. |
| 2014/0211535 A1 | 7/2014 | Nickel |
| 2014/0369132 A1 | 12/2014 | Cernea |
| 2015/0340091 A1 | 11/2015 | Zhu |
| 2016/0343431 A1* | 11/2016 | Lesartre ............... G11C 13/004 |
| 2017/0271001 A1 | 9/2017 | Muralimanohar |

OTHER PUBLICATIONS

International Searching Authority, The International Search Report and the Written Opinion, PCT/US2015/013877, dated Oct. 22, 2015, 12 Pages.

International Searching Authority, The International Search Report and the Written Opinion, PCT/US2015/040287, dated Apr. 29, 2016, 11 Pages.

Linn et al., "Complementary resistive switches for passive nanocrossbar memories," Nature Materials, Apr. 2010, 4 Pgs.

Liu, B. et al., Reduction and IR-DROP Compensations Techniques for Reliable Neuromorphic Computing Systems, Nov. 3, 2014, 8 Pages.

* cited by examiner

DETERMINING FIRST WRITE STRENGTH

BACKGROUND

Memory elements may be used to store data. A number of memory elements may be arranged in a memory array. Data may be stored in memory elements by assigning logic values, such as zeros and ones, to the memory elements within the memory array. In some examples, a memory array may be arranged in a cross-point array where a number of row lines intersect a number of column lines to form a grid, with memory elements placed at each intersection of the grid.

BRIEF DESCRIPTION OF THE DRAWINGS

Various examples will be described below with reference to the accompanying drawings.

Throughout the drawings, identical reference numbers may designate similar, but not necessarily identical, elements.

DETAILED DESCRIPTION

Figure 1:
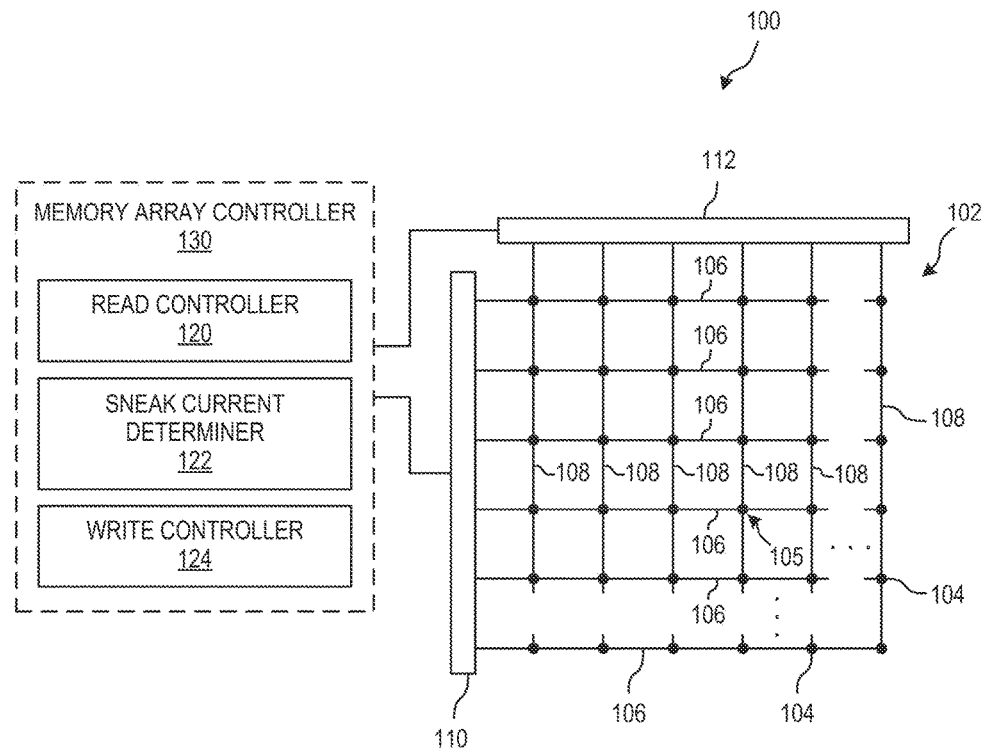
FIG. 1 is a diagram of an example system for determining a first write strength for writing a desired memory value to a target memory element, according to an implementation.

A cross-point array of memory elements may include memory elements at the intersections of a number of row lines (also referred to as word lines) and a number of column lines (also referred to as bit lines). A cross-point array architecture may allow for dense storage of data with low-power consumption and reduced manufacturing cost. A data value, such as zero or one, may be written to a memory element in the cross-point array by controlling row line and column line drivers to apply a write voltage across the memory element (e.g., by applying the write voltage to the row and column lines on which the memory element is located). The write voltage may be a pulse having a voltage of sufficient amplitude and appropriate polarity to change the storage state of the memory element. To read a stored value at a memory element, a read voltage may be applied to row and column lines that cross the memory element, and a current passing through the memory element may be measured.

However, the current and voltage drops over a target memory element addressed at the intersection of a row line and a column line may be affected by various factors. For example, sneak current (also referred to as leakage current) may be a factor that affects the current and voltage drops over a target memory. Sneak current may be a diverted portion of the current addressed to a target memory element that flows instead through other paths and memory elements, owing to multiple memory elements being connected to each other on the row line and column line addressing the target memory element. Another example factor may be the resistance along the row and column lines connected to the targeted memory element, and the resultant reduction in voltage along the lines. The resistance may be related to the location of a memory element in the cross-point array, since memory elements farther away from the row line and column line drivers may be on longer paths and thus have a higher path resistance (i.e., electrical resistance) than memory elements that are closer to the drivers. Together, the sneak current and the resistance may produce an IR voltage drop that affects (e.g., reduces) the current and voltage actually delivered to the target memory element, and as a result, the write attempt may be unsuccessful in setting the memory element to the desired value.

An approach to compensating for such voltage effects may include writing to the memory element, reading the memory element to verify whether the write was successful, and performing a more aggressive write attempt if the prior write was not successful. In some instances, particularly for a memory element affected by a significant IR voltage drop (e.g., compared to other memory elements in the cross-point array), the foregoing write-and-verify cycle may be performed many times before the write is ultimately successful and may thus result in an undesirable write latency. At the same time, overshooting the write voltage sufficient to set the memory element to the desired memory value also may be detrimental, as an over-voltage may, for example, reduce the longevity of the memory element. Accordingly, it may be useful to determine how aggressive a first write attempt should be (e.g., the voltage amplitude, pulse duration, etc.) based on the IR voltage drop without overshooting the write voltage sufficient to set the memory element, so as to reduce the number of iterative write attempts and thus reduce write latency.

Referring now to the figures, FIG. 1 is a diagram of an example system 100 for determining a first write strength for writing a desired memory value to a target memory element, according to an implementation. The system 100 may be implemented in an electronic device, such as, for example, a server, a desktop computer, a laptop computer, a mobile device, a smartphone, a gaming system, or a tablet device, among other electronic devices. In some implementations, system 100 may be or form part of a memory module (e.g., a dual in-line memory module form factor or the like) that is installable in an electronic device.

The system 100 may include a cross-point array 102 of memory elements 104. In some implementations, the cross-point array 102 may include a number of row lines 106 (also referred to as word lines) and a number of column lines 108 (also referred to as bit lines). Individual ones of the row lines 106 may cross individual ones of the column lines 108 at crossing points, and a memory element 104 may be located at each crossing point. For example, the cross-point array 102 may include m-number of row lines 106 and n-number of column lines 108 and may thus include a total of m-by-n memory elements 104. For simplicity, a subset of memory elements 104 have been identified with reference numbers on FIG. 1, but each memory element 104 in the cross-point array 102 may share similar characteristics and functionality. In some implementations, the row lines 106 and the column lines 108 may be conductors, such as wires. In some implementations, the row lines 106 and the column lines 108 may be formed in different circuit planes. Moreover, the row lines 106 and the column lines 108 may be formed of a variety of shapes, and may likewise form a grid of a variety of shapes. The cross-point array 102 may be a part or subdivision, such as a bank or sub-bank, of a larger memory pool or array of an electronic device. The row lines 106 may be controlled by row line driver 110 (also referred to as a word line driver). Similarly, the column lines 108 may be controlled by the column line driver 112 (also referred to as bit line driver).

Various types of memory may be employed as the memory element 104. In some instances, the memory element 104 may be a memristor, which may also be referred to as resistive random access memory (RRAM or ReRAM). A memristor is a two-terminal electrical device having or exhibiting an instantaneous resistance level or state that is substantially a function of bias history (i.e., a history of electrical current that flowed through the memristor). For example, a memristor may include a matrix material that contains mobile dopants that may be moved within the matrix material to dynamically alter the electrical operation of the memristor. In some implementations, a write voltage may be applied across terminals of the memristor to induce motion of the dopants to set, select or program a resistance of the memristor. Once programmed, the memristor may retain the programmed resistance for a period of time after the bias is removed (e.g., until reprogrammed). As such, a memristor is a two-terminal device that may function as a non-volatile memory where the programmed resistance is stored without the application of power to the memristor. In some implementations, a memristor may be programmed to low or high resistance to represent a binary bit or may be programmed to one of multiple levels of resistance to represent a multi-bit value.

In some instances, the memory element 104 may be a phase change memory (PCM), PCM also may be a two-terminal non-volatile memory device. PCM includes a phase change material, such as chalcogenide glass, that may transition between a high resistance amorphous state and a low resistance crystalline state depending on characteristics of the write voltage (e.g., voltage amplitude, pulse duration, etc.) applied across its terminals. In other instances, the memory element 104 may also employ various types of memory other than memristor and PCM, and in particular, other types of two-terminal non-volatile memory.

In some examples, a selector may be placed in series with a memory element 104. The selector may have a threshold voltage, which may be, for example, less than the voltage for reading from or writing to a memory element 104. In some implementations, the threshold voltage may be half of the minimum voltage for reading from or writing to a memory element 104. An applied voltage less than the threshold voltage does not pass through to the corresponding memory element and thus a portion of a sneak current may be reduced. However, even while an applied voltage may be less than the threshold voltage of the selector, a small amount of sneak current may still flow through the cross-point array 102.

To write a value to a memory element 104 (e.g., a memristor), a write voltage having a particular amplitude and appropriate polarity (and/or a particular pulse duration) may be applied across the memory element 104 as described above by a row line driver 110 and a column line driver 112. For example, in the case of a memristor, the write voltage may cause movement of dopants within the memristor, which in turn may alter the resistance of the memristor. To read a value from the memory element 104, the row line driver 110 and column line driver 112 may apply a voltage to the memory element 104 and a corresponding output current may be read by sense amps of the column line driver 112. For example, for a memristor memory element 104, the read voltage may be a voltage that allows the internal electrical resistance of the memory element 104 to be sensed but does not generate sufficiently high electrical field to cause significant dopant movement.

The system 100 may include a read controller 120, a sneak current determiner 122, and a write controller 124. Some or all of the read controller 120, the sneak current determiner 122, and the write controller 124 may be included in a memory array controller 130. In some implementations, the write controller 124 (or more generally, the memory array controller 130) and the cross-point array 102 may be located on the same die or chip of a memory module. In some implementations, the read controller 120, the sneak current determiner 122, or the write controller 124 may be implemented as a set of instructions encoded on a machine readable medium and executable by a processor (e.g., such as microprocessor, an application-specific integrated circuit, a field programmable gate array, and/or other hardware device suitable for retrieval and/or execution of instructions). In some implementations, the memory array controller 130 may be such a processor to execute instructions. Additionally or alternatively, the read controller 120, the sneak current determiner 122, or the write controller 124 may be implemented as a hardware device comprising electronic circuitry.

The read controller 120, the sneak current determiner 122, and/or the write controller 124 (or more generally, the memory array controller 130) may be coupled to the cross-point array 102 via the row line driver 110 and the column line driver 112. The memory array controller 130 may receive commands from an electronic device to read data from or to write data to an address or addresses in the cross-point array 102. An address may relate to a particular memory element 104, and moreover, to a particular memory element 104 having a physical location in the cross-point array 102. A memory element 104 addressed by either a read command or a write command may be referred to herein as a target memory element 105. FIG. 1 illustrates a particular target memory element 105 for convenience, although it should be understood that any of the plurality of memory elements 104 may be addressed as a target memory element 105.

In some implementations, the read controller 120 may control reading of a memory element 104. For example, the read controller 120 may respond to a command to read data from an address by controlling the row line driver 110 and the column line driver 112 to apply a read voltage to the target memory element 105 corresponding to the address and to sense the read output current on the column line 108 on which the target memory element 105 is located. Based on the read output current and the applied read voltage, the read controller 120 may ascertain the resistance, and hence the stored data value, of the target memory element 105. However, sneak currents may flow through to the column line 108, thus obfuscating the current that flowed through the target memory element 105. In some implementations, the read controller 120 may operate in conjunction with the sneak current determiner 122 in the following manner to mitigate or reduce an effect of sneak current on the accuracy of the measured resistance.

In some implementations, the sneak current determiner 122 may measure a sneak current associated with a target memory element 105. For example, the sneak current determiner 122 may control the row line driver 110 and the column line driver 112 to apply a pre-access voltage to the cross-point array 102 and may measure the resultant sneak current that leaks through to the column line 108 on which the target memory element 105 resides. The term "pre-access" may refer to a nature of preceding an access of a memory element 104 (i.e., a read or write operation). In some implementations, the pre-access voltage may be less than the read voltage, and more particularly, may be less than the selector threshold voltage. The sneak current determiner 122 may also employ other techniques for measuring the sneak current related to a target memory element 105, such as contemporaneously measuring sneak current for multiple memory elements 104.

In some implementations, the sneak current determiner 122 may measure the sneak current before the read controller 120 applies a read voltage to the target memory element 105 and measures the read output current. To separate the sneak current from the current flowed through the target memory element 105, the read controller 120 may subtract the sneak current from the read output current. The read controller 120 may determine a resistance based on the resulting difference current and the applied read voltage.

In some implementations, the write controller 124 may control writing to a memory element 104. For example, the write controller 124 may receive a command to write data, and the command may include an address of a target memory element 105 in the cross-point array 102 and a desired memory value for the target memory element 105. In response to the command, the write controller 124 may determine a first write strength that accounts for (or compensates for) IR voltage drop that may affect the voltage delivered to the target memory element 105, and may then apply the first write strength so determined to the target memory element 105 (i.e., via control of the row line driver 110 and the column line driver 112). The phrase "first write strength" may refer to a write voltage, characterized by a voltage amplitude, a pulse duration, and the like, that is applied to the targeted memory element 105 in a first attempt at writing the desired memory value. As will now be described, the write controller 124 may determine the first write strength for writing the desired memory value to the target memory element 105 based on a sneak current measurement, a resistance associated with the address of the target memory element 105, or a combination thereof.

In some implementations, the write controller 124 may receive a sneak current measurement associated with the target memory element 105. For example, the write controller 124 may receive the sneak current measurement from the sneak current determiner 122 described above. In some implementations, the sneak current determiner 122 may measure the sneak current as part of a pre-write verification process. For example, the system 100 may initially respond to a write command by verifying if the desired memory value is already stored in the target memory element 105 (If the desired memory value is already stored, no write is attempted), where the verifying includes measuring the sneak current and reading the target memory element 105 in a manner similar to that described above. In some instances, the write controller 124 may more accurately determine the first write strength (in a manner to be described below) by using a recent sneak current measurement from the pre-write verification, because sneak current paths and sneak current measurements may depend on the resistance values of the memory elements 104 (particularly the memory elements 104 near the target memory element 105) and resistance values may be dynamic and variable.

In some implementations, the write controller 124 may identify a resistance associated with the address of the target memory element 105, by virtue of the address relating to a physical location in the cross-point array 102 (e.g., an intersection of a particular row and column lines) and the physical location relating to a current path between row driver 110 and column driver 112 through the target memory element 105. That current path may have a resistance that includes at least the resistance along the row line 106 and the column line 108 connected to the target memory element 105. Addresses of memory elements 104 on longer current paths (e.g., farther away the row line driver 110 and/or the column line driver 112) may be associated with a higher resistance than addresses of memory elements 104 with relatively shorter current paths (e.g., closer to the row line driver 110 and/or the column line driver 112). This resistance may also be referred to herein as the address-associated resistance. Constitution of the resistance, and thus the resistance value, may vary depending on the architecture of the cross-point array 102, which may implicate other resistances such as, for example, resistance from parallel paths, the row driver 110, and the column driver 112, among other resistances.

Figure 2A:
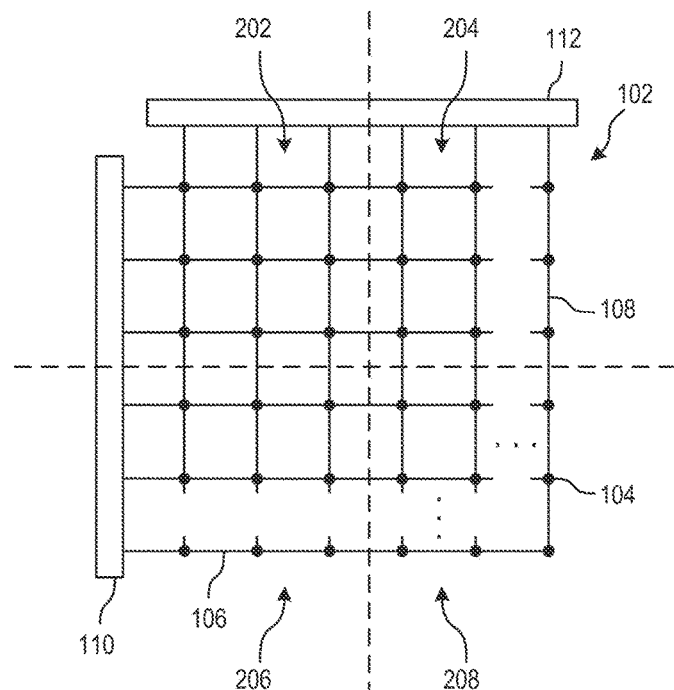
FIG. 2A is a diagram of the example system of FIG. 1 virtually divided into zones associated with resistances.
Figure 2B:
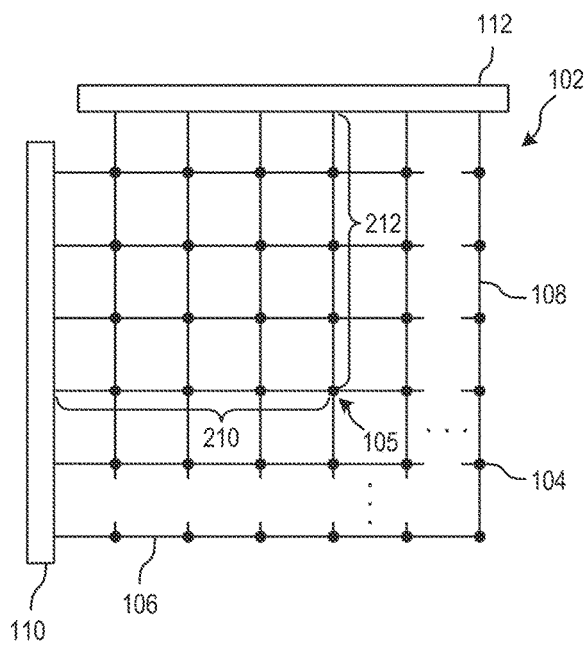
FIG. 2B is a diagram of the example system of FIG. 1 showing a current path for a target memory element.

In some implementations, the write controller 124 may identify the address-associated resistance according to a resistance look up table. For example, in a resistance look up table, addresses may be individually associated with a resistance. In another example, addresses of the cross-point array 102 may be divided virtually into zones such as quadrants (other zone configurations also may be suitable), and each zone may be associated with a resistance. To illustrate, FIG. 2B depicts a cross-point array 102 divided into quadrants 202, 204, 206, 208. Quadrant 208 may include addresses associated with high resistance (memory elements 104 that are farthest from the drivers 110, 112), quadrant 202 may include addresses associated with low resistance (memory elements 104 that are close to the drivers 110, 112), and quadrants 204, 206 may include addresses associated with a medium resistance (memory elements 104 that are between those of quadrants 202, 208 in terms of distance to the drivers 110, 112).

In some implementations, the write controller 124 may utilize a resistance equation (e.g., encoded as machine readable instructions) to calculate the address-associated resistance. For example, resistance may be calculated according to the following equation.

$$R=\rho(L/A)$$

In the preceding equation, $\rho$ is an electrical resistivity (e.g., having units of ohm-meters) along the current path through the target memory element 105 (e.g., resistivity of row line 106 and column line 108) and A is a cross-sectional area of the current path through the target memory element 105 (e.g., cross-sectional area of row line 106 and column line 108), both of which may be related to the design and architecture of the cross-point array 102. As for the value of L, the write controller 124 may convert the address of the target memory element 105 to a length L based on a line segment 210 and a column line segment 212 on the current path through the target memory element 105, as illustrated in FIG. 2B. In the foregoing examples, aspects of the resistance look up table and the resistance equation (e.g., resistance values in the resistance look up table; parameters or the like of the resistance equation) may be pre-determined based on the design, manufacturing specifications, and/or calibration or quality control test results of the cross-point array 102, and encoded into the write controller 124.

In some implementations, the write controller 124 may utilize the sneak current measurement (e.g., received from the sneak current determiner 122) and/or the address-associated resistance to determine the first write strength. More particularly, in some implementations, the write controller 124 may determine (i.e., calculate, choose, resolve) a first write strength that is commensurate with a magnitude of an IR voltage drop along the current path that includes the target memory element 105, where the IR voltage drop may be proportional to the resistance (which contributes to the resistance "R" of "IR" Voltage drop) and the sneak current measurement (which may contribute to the current "I" of "IR" voltage drop).

In some implementations, the write controller 124 may utilize a write strength equation (e.g., a predetermined equation encoded as machine readable instructions) to determine the first write strength, such as the following equation that determines a voltage amplitude of the first write strength, $V_{FIRST\ WRITE}$.

$$V_{FIRST\ WRITE} = V_{TARGET} + (I_{SNEAK} + I_{TARGET}) \times R$$

In the foregoing example of a write strength equation, $V_{TARGET}$ and $I_{TARGET}$ may relate to a theoretical bias sufficient to set the target memory element 105 to the desired memory value (e.g., in an ideal situation, without consideration for IR voltage drop, etc.), $I_{SNEAK}$ may be the sneak current measurement provided by the sneak current determiner 122, and R may be the address-associated resistance identified by the write controller 124. Other example equations may also be suitable for determining the first write strength.

In some implementations, the write controller 124 may determine the first write strength based on a write strength look up table. For example, the write strength look up table may be a two-dimensional table, having sneak current measurements as indices in one dimension, address-associated resistances as indices in another dimension, and first write strengths (e.g., a voltage amplitude $V_{FIRST\ WRITE}$) pre-populated for each index pair. For a given write command, the write controller 124 may look up the first write strength in such a write strength look up table according to the received sneak current measurement and the identified address-associated resistance.

The aforementioned write strength equation and write strength look up table may be implemented using either the sneak current measurement or the address-associated resistance alone. For example, in some implementations, the write strength look up table may be a one-dimensional table using sneak current measurements as indices, and the write strength equation may use a pre-determined resistance constant. In some implementations, the first write strength may be adjusted (e.g., reduced) by a safety margin, for example, to avoid overshooting the target voltage. The safety margin may vary depending on properties of the cross-point array 102 (e.g., per design, per manufacturing tolerances, etc.).

The write controller 124 may control the row line driver 110 and the column line driver 112 to apply the first write strength as determined above to the target memory element 105. After applying the first write strength, in some implementations, the system 100 may then iteratively read the target memory element 105 (via the read controller 102), verify if the desired memory value was successfully written to the target memory element 105, and apply (via the write controller 124) a more aggressive write strength to the target memory element 105 if necessary. For example, a more aggressive write strength may have a higher voltage amplitude, a longer pulse duration, or both a higher voltage amplitude and longer pulse duration, in comparison to a preceding write attempt. In some implementations, the increase in voltage amplitude or pulse duration may be a percentage increase, an absolute increase, or the like, and such increase may also be a function of the sneak current measurement and/or the address-associated resistance.

Figure 3:
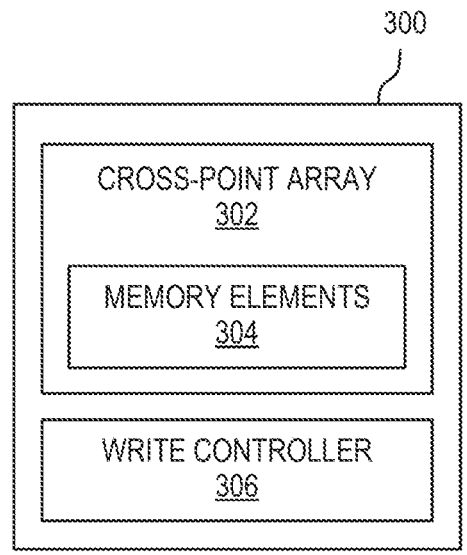
FIG. 3 is a diagram of an example system for determining a first write strength for writing a desired memory value to a target memory element, according to another implementation.

FIG. 3 is a diagram of an example system 300 for determining a first write strength for writing a desired memory value to a target memory element, according to another implementation. The system may include a cross-point array 302 of memory elements 304 and a write controller 306 coupled to the cross-point array 302. The write controller 306 may receive an address of a target memory element in the cross-point array 302, may receive a desired memory value for the target memory element, and may receive a sneak current measurement associated with the target memory element. The write controller 306 may determine a first write strength for writing the desired memory value to the target memory element based on the sneak current measurement. The write controller 306 may apply the first write strength to the target memory element.

Figure 4:
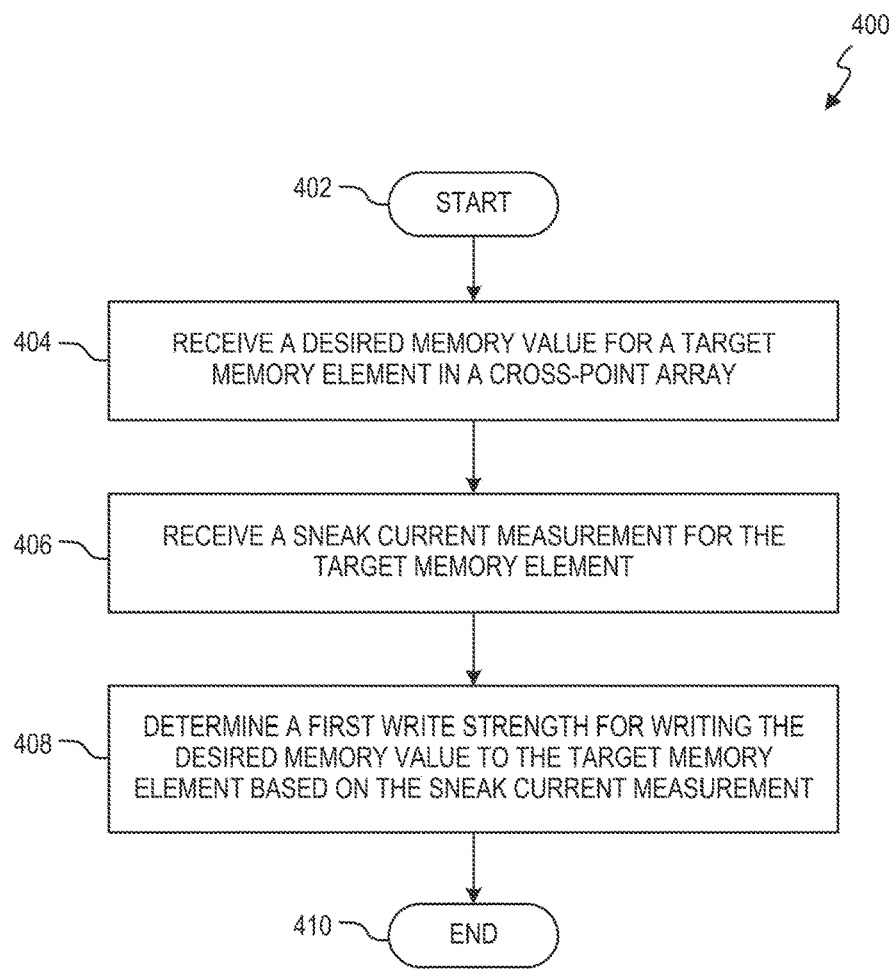
FIG. 4 is a flowchart of an example method for determining a first write strength for writing a desired memory value to a target memory element, according to an implementation.

FIG. 4 is a flowchart of an example method 400 for determining a first write strength for writing a desired memory value to a target memory element, according to an implementation. Method 400 may be described below as being executed or performed by the system 100, although various other systems may be used as well, such as, for example, the system 300. Method 400 may be implemented in the form of executable instructions stored on a machine readable storage medium and executed by at least one processor, and/or in the form of electronic circuitry. In some implementations of the present disclosure, one or more blocks of method 400 may be executed substantially concurrently or in a different order than shown in FIG. 4. In some implementations of the present disclosure, method 400 may include more or less blocks than are shown in FIG. 4. In some implementations, one or more of the blocks of method 400 may, at certain times, be ongoing and/or may repeat.

The method 400 may begin at block 402, and continue to block 404, where the system 100 (particularly, the write controller 124) may receive a desired memory value for a target memory element (e.g., 105) in a cross-point array (e.g., 102) of memory elements (e.g., 104), for example, as part of a write command from an electronic device. In some implementations, the memory elements may be a resistive random access memory (e.g., memristor) or a phase change memory. At block 406, the system 100 (particularly, the write controller 124) may receive a sneak current measurement for the target memory element (e.g., 105). For example the sneak current measurement may be received from a sneak current determiner (e.g., 122). At block 408, the system 100 (particularly, the write controller 124) may determine a first write strength for writing the desired memory value to the target memory element (e.g., 105) based on the sneak current measurement received at block 406. For example, the first write strength may be determined to have a voltage amplitude that is the theoretical bias sufficient to set the target memory element (e.g., 105) to the desired memory value plus an offset voltage to compensate for IR voltage drop, where the offset voltage is proportional at least to the sneak current measurement received at block 406. The method may end at block 410.

Figure 5:
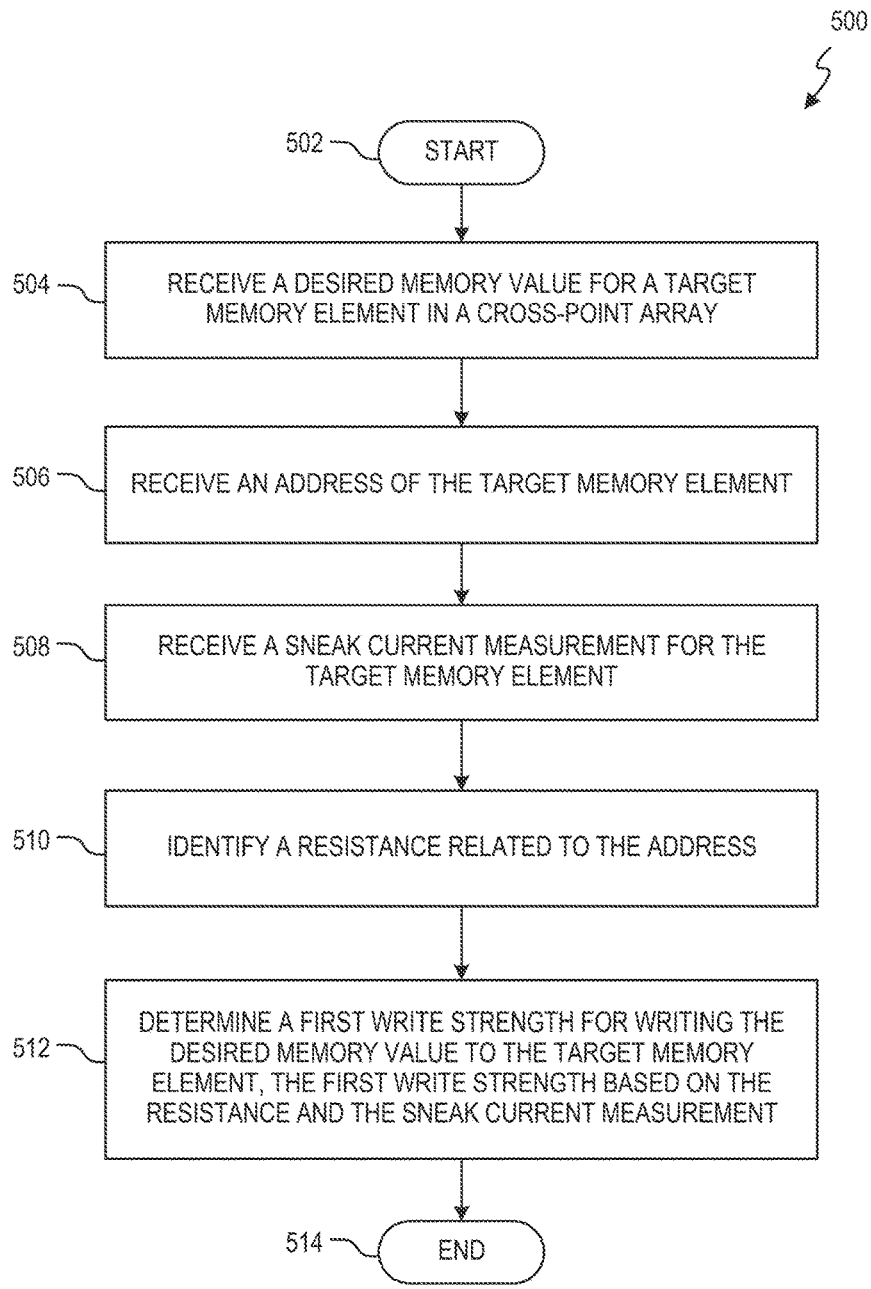
FIG. 5 is a flowchart of an example method for determining a first write strength for writing a desired memory value to a target memory element, according to another implementation.

FIG. 5 is a flowchart of an example method 500 for determining a first write strength for writing a desired memory value to a target memory element, according to an implementation. Method 500 may be described below as being executed or performed by the system 100, although various other systems may be used as well, such as, for example, the system 300. Method 500 may be implemented in the form of executable instructions stored on a machine readable storage medium and executed by at least one processor, and/or in the form of electronic circuitry. In some implementations of the present disclosure, one or more blocks of method 500 may be executed substantially concurrently or in a different order than shown in FIG. 5. In some implementations of the present disclosure, method 500 may include more or less blocks than are shown in FIG. 5. In some implementations, one or more of the blocks of method 500 may, at certain times, be ongoing and/or may repeat.

The method 500 may begin at block 502, and continue to block 504, where the system 100 (particularly, the write controller 124) may receive a desired memory value for a target memory element (e.g., 105) in a cross-point array (e.g., 102) of memory elements (e.g., 104), for example, as part of a write command from an electronic device. At block 506, the system 100 (particularly, the write controller 124) may receive an address of the target memory element (e.g., 105). For example, the address may relate to a location or position of the target memory element (e.g., 105) within the cross-point array (e.g., 102), and more particularly, on a particular row line (e.g., 106) and a particular column line (e.g., 108). At block 508, the system 100 (particularly, the write controller 124) may receive a sneak current measurement for the target memory element (e.g., 105). At block 510, the system 100 (particularly, the write controller 124) may identify a resistance related to the address received at block 506. For example, the resistance may be identified according to a resistance look up table or to a resistance equation, as described above with reference to FIGS. 1, 2A, and 2B.

At block 512, the system 100 (particularly, the write controller 124) may determine a first write strength for writing the desired memory value to the target memory element (e.g., 105) based on the sneak current measurement received at block 508 and the resistance identified at block 510. In some implementations, block 512 may include determining an IR voltage drop of the cross-point array (e.g., 102) that affects the voltage applied to the target memory element (e.g., 105), where the IR voltage drop may be a function of the sneak current measurement received at block 508 and the resistance identified at block 510, as described above with reference to FIG. 1. Block 512 may also include setting a parameter of the first write strength (such as voltage amplitude, pulse duration, etc.) to compensate for the IR voltage drop. For example, the first write strength may be set according to a write strength look up table or a write strength equation, as described above with reference to FIG. 1. The method 500 may end at block 514.

Figure 6:
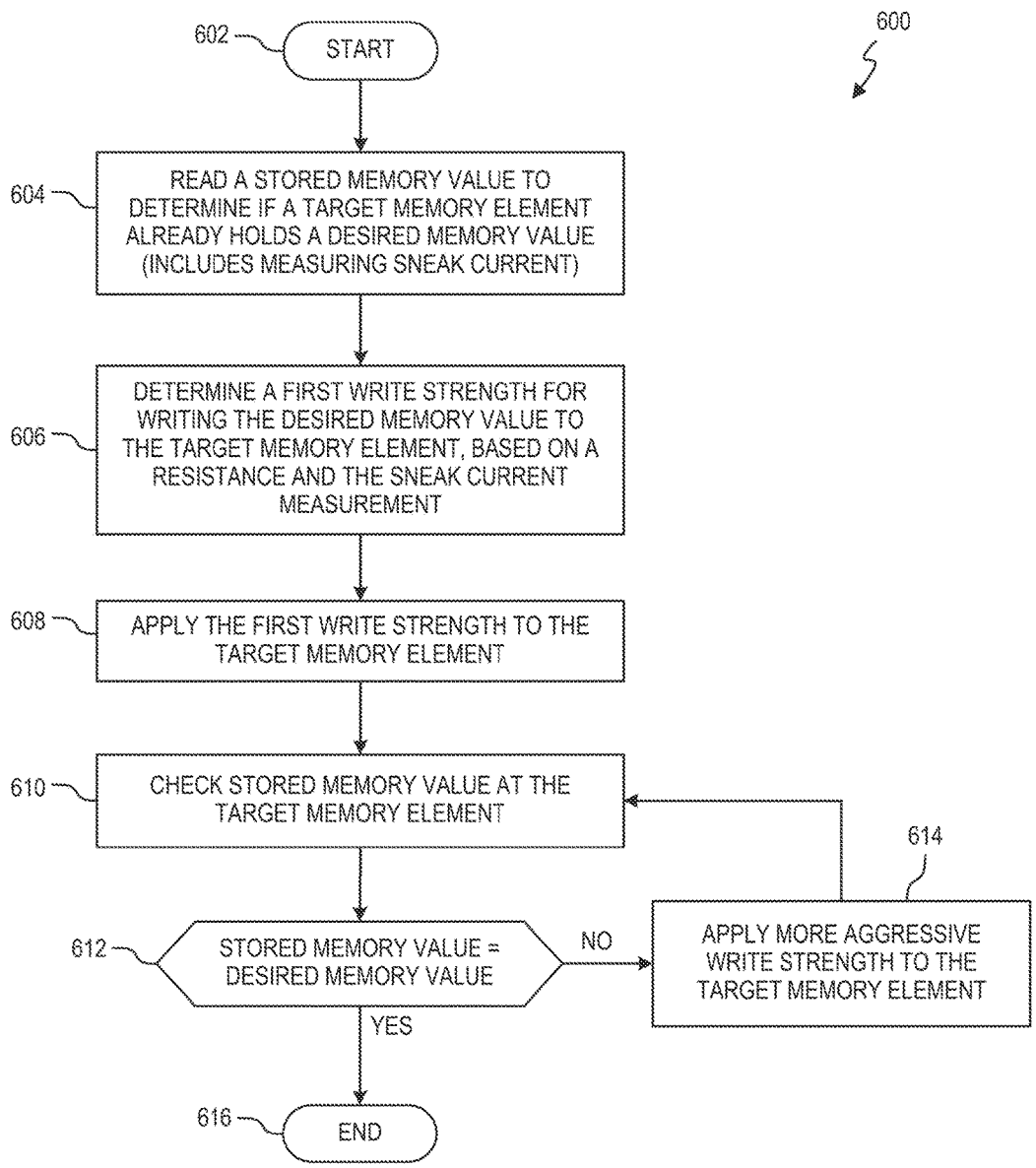
FIG. 6 is a flowchart of an example method for applying a first write strength to a target memory element, according to an implementation.

FIG. 6 is a flowchart of an example method 600 for applying a first write strength to a target memory element, according to an implementation. Method 600 may be described below as being executed or performed by the system 100, although various other systems may be used as well, such as, for example, the system 300. Method 600 may be implemented in the form of executable instructions stored on a machine readable storage medium and executed by at least one processor, and/or in the form of electronic circuitry. In some implementations of the present disclosure, one or more blocks of method 600 may be executed substantially concurrently or in a different order than shown in FIG. 6. In some implementations of the present disclosure, method 600 may include more or less blocks than are shown in FIG. 6. In some implementations, one or more of the blocks of method 600 may, at certain times, be ongoing and/or may repeat. Prior to beginning the method 600 at block 602, the system 100 may receive a command to write a desired memory value addressed to a target memory element (e.g., 105) in a cross-point array (e.g., 102).

The method 600 may begin at block 602, and continue to block 604, the system 100 (particularly, the read controller 120) may read a stored memory value from the target memory element (e.g., 105) prior to applying a first write strength to the target memory element (e.g., 105) to determine if the target memory element (e.g., 105) already holds the desired memory value. In some implementations, reading the target memory element (e.g., 105) may include measuring a sneak current (e.g., by a sneak current determiner 122). At block 606, the system 100 (particularly, the write controller 124) may determine a first write strength for writing the desired memory value to the target memory element (e.g., 105) based on a sneak current measurement and a resistance. For example block 606 may be performed using a sneak current measurement received in a manner analogous to block 508 of method 500 and using a resistance identified in a manner analogous to block 510 of method 500, In some implementations, block 606 may be performed in a manner analogous to block 512 of method 500.

At block 608, the system 100 (particularly, the write controller 124) may apply the first write strength determined at block 606 to the target memory element (e.g., 105). At block 610, the system 100 (particularly, the read controller 120) may check a stored memory value at the target memory element (e.g., 105) after applying the first write strength at block 608. If the stored memory value does not equal the desired memory value ("NO" at decision block 612), the system 100 may apply a more aggressive write strength to the target memory element (e.g., 105) at block 614 and then return to block 610 to check again whether the stored memory value equals the desired memory value. If the stored memory value does equal the desired memory value ("YES" at decision block 612), control may pass to block 616, where the method 600 may end.

Figure 7:
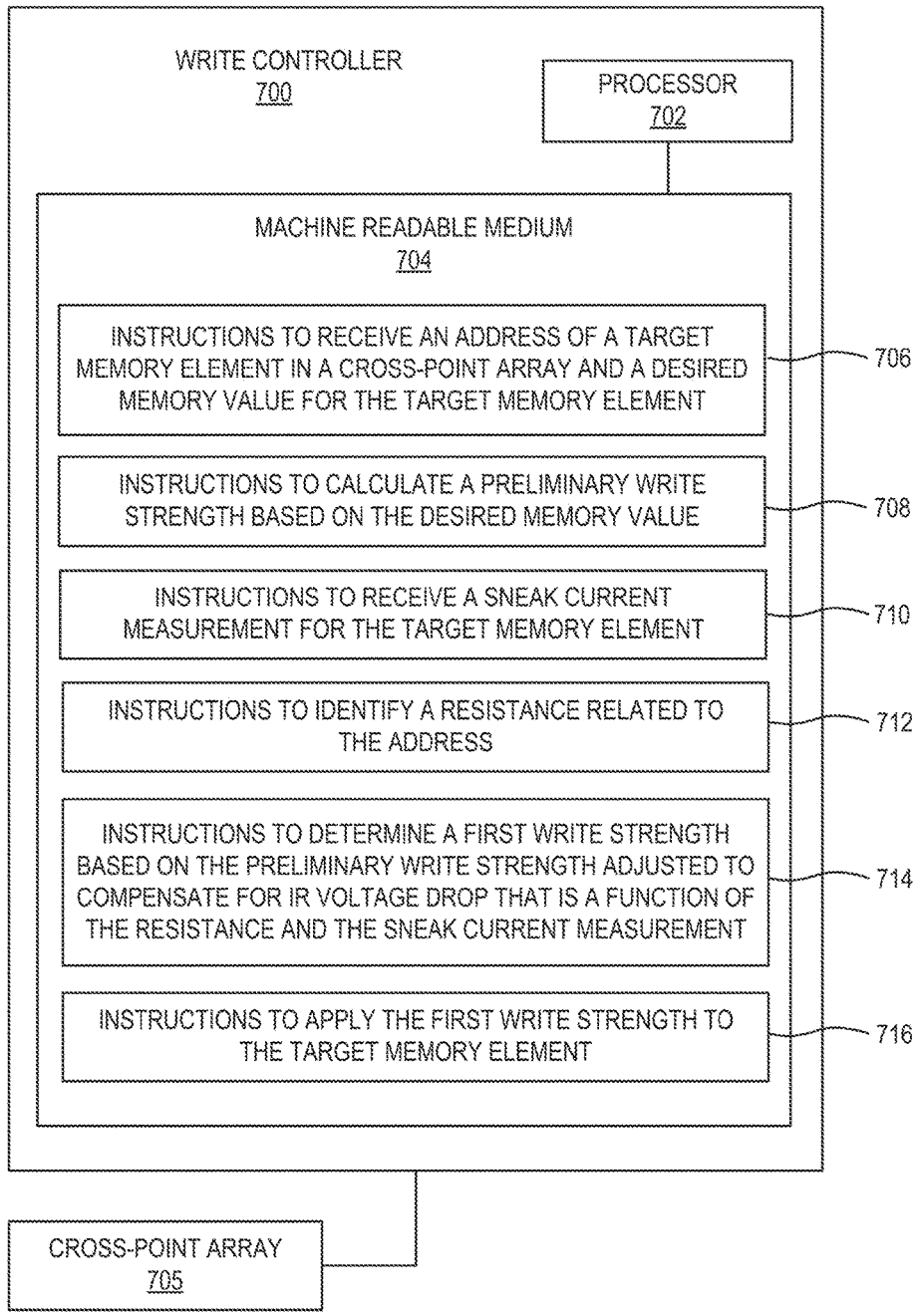
FIG. 7 is a block diagram of a write controller that includes a non-transitory, machine readable medium encoded with example instructions to determine a first write strength, according to an implementation.

FIG. 7 is a block diagram illustrating a write controller 700 that includes a machine readable medium encoded with example instructions to determine a first write strength, according to an implementation. In some implementations, the write controller 700 may serve as or form part of the write controller 100 of FIG. 1 or the write controller 300 of FIG. 3. In some implementations, the write controller 700 may include at least one processor 702 coupled to a machine readable medium 704. The processor 702 may include a single-core processor, a multi-core processor, an application-specific integrated circuit, a field programmable gate array, and/or other hardware device suitable for retrieval and/or execution of instructions from the machine readable medium 704 (e.g., instructions 706, 708, 710, 712, 714, 716) to perform functions related to various examples. Additionally or alternatively, the processor 702 may include electronic circuitry for performing the functionality described herein, including, but not limited to, the functionality of instructions 706, 708, 710, 712, 714 and/or 716. With respect to the executable instructions represented as boxes in FIG. 7, it should be understood that part or all of the executable instructions and/or electronic circuits included within one box may, in alternate implementations, be included in a different box shown in the figures or in a different box not shown. In some implementations, the write controller 700 may be coupled to a cross-point array 705 of memory elements.

The machine readable medium 704 may be any medium suitable for storing executable instructions, such as random access memory (RAM), electrically erasable programmable read-only memory (EEPROM), flash memory, hard disk drives, optical discs, and the like. In some example implementations, the machine readable medium 704 may be a tangible, non-transitory medium, where the term "non-transitory" does not encompass transitory propagating signals. As described further herein below, the machine readable medium 704 may be encoded with a set of executable instructions 706, 708, 710, 712, 714, 716.

Instructions 706, when executed by the processor 702, may receive an address of a target memory element in the cross-point array 705 and a desired memory value for the target memory element. Instructions 708, when executed by the processor 702, may calculate a preliminary write strength based on the desired memory value. For example, the preliminary write strength may be a theoretical bias sufficient to set the target memory element to the desired memory value. Instructions 710, when executed by the processor 702, may receive a sneak current measurement for the target memory element. Instructions 712, when executed by the processor 702, may identify a resistance related to the address.

Instructions 714, when executed by the processor 702, may determine a first write strength based on the preliminary write strength (e.g., calculated by instructions 708) adjusted to compensate for an IR voltage drop of the cross-point array that affects a voltage applied to the target memory element. As described above, the IR voltage drop may be a function of the resistance and the sneak current measurement. Instructions 714 may include instructions to adjust a parameter of the preliminary write strength to compensate for the IR voltage drop, such parameter including a voltage amplitude, a pulse duration, or the like. For example, to derive a first write strength that compensates for the IR voltage drop, the voltage amplitude of the preliminary write strength may be increased or the pulse duration of the preliminary write strength may be increased. In some implementations, instructions 714 may determine the first write strength using a write strength look up table or a write strength equation, as described above with reference to FIG. 1. Instructions 716, when executed by the processor 702, may apply the first write strength to the target memory element.

In view of the foregoing description, it can be appreciated that a system may determine a first write strength for writing a desired memory value to a target non-volatile memory element in a cross-point array based on a sneak current measurement and resistance associated with the target memory element. By virtue of a first write strength so determined, weak write strengths may be skipped in an iterative write-and-verify process, thus reducing the number of write attempts before the target memory element is successfully set to the desired memory value and also reducing write latency and power consumption accordingly.

In the foregoing description, numerous details are set forth to provide an understanding of the subject matter disclosed herein. However, implementation may be practiced without some or all of these details. Other implementations may include modifications and variations from the details discussed above. It is intended that the following claims cover such modifications and variations.

I claim:

1. A method comprising:
receiving a desired memory value for a target memory element in a cross-point array of memory elements;
receiving an address of the target memory element in the cross-point array;
identifying a resistance related to the address;
receiving a sneak current measurement for the target memory element; and
determining a first write strength for writing the desired memory value to the target memory element based on the sneak current measurement, wherein the determining the first write strength includes:
determining an IR voltage drop of the cross-point array that affects a voltage applied to the target memory element, the IR voltage drop being a function of the resistance and the sneak current measurement, and
setting a parameter of the first write strength to compensate for the IR voltage drop according to a lookup table or a write strength equation, the parameter including a voltage amplitude or a pulse duration.

2. The method of claim 1, further comprising:
applying the first write strength to the target memory element;
checking a stored memory value at the target memory element after applying the first write strength; and
if the stored memory value does not equal the desired memory value, applying a more aggressive write strength to the target memory element.

3. The method of claim 1, further comprising reading a stored memory value from the target memory element prior to applying the first write strength to determine if the target memory element already holds the desired memory value, wherein the reading includes measuring the sneak current measurement.

4. The method of claim 1, wherein the memory element is a resistive random access memory or a phase change memory.

5. The method of claim 1, wherein the write strength equation calculates the voltage amplitude of the first write strength as the sum of a target voltage and an offset,
the offset being the resistance multiplied by the sum of the sneak current measurement and a target current, and
the target voltage and the target current relate to an ideal theoretical bias for setting the target memory element to the desired memory value.

6. The method of claim 1, wherein the lookup table includes zones into which the cross-point array is divided and a respective resistance for each of the zones, and
the identifying the resistance related to the address includes looking up the respective resistance of a zone to which the address belongs.

7. A system comprising:
a cross-point array of memory elements; and
a write controller coupled to the cross-point array, the write controller to:
receive an address of a target memory element in the cross-point array,
identify a resistance associated with the address,
receive a desired memory value for the target memory element,
receive a sneak current measurement associated with the target memory element, determine a first write strength for writing the desired memory value to the target memory element, wherein the write controller determines the first write strength to be commensurate with a magnitude of an IR voltage drop along a current path that includes the target memory element, the IR voltage drop being proportional to the resistance and the sneak current measurement, and apply the first write strength to the target memory element.

8. The system of claim 7, wherein the memory element is a resistive random access memory.

9. The system of claim 7, further comprising circuitry to measure the sneak current measurement.

10. The system of claim 7, wherein the write controller determines the first write strength based on a lookup table or a write strength equation.

11. The system of claim 10, wherein the write strength equation calculates a voltage amplitude for the first write strength as the sum of a target voltage and an offset, the offset being the resistance multiplied by the sum of the sneak current measurement and a target current, and the target voltage and the target current relate to an ideal theoretical bias for setting the target memory element to the desired memory value.

12. The system of claim 7, wherein the memory element is a phase change memory.

13. The system of claim 7, further comprising a read controller to check a stored memory value at the target memory element after the write controller applies the first write strength, wherein, responsive to the stored memory value being not equal to the desired memory value, the write controller is to apply a more aggressive write strength to the target memory element.

14. The system of claim 13, wherein the more aggressive write strength has a higher voltage amplitude, a longer pulse duration, or both a higher voltage amplitude and longer pulse duration relative to the first write strength.

15. The system of claim 7, further comprising a read controller to read a stored memory value from the target memory element prior to the write controller applying the first write strength to determine if the target memory element already holds the desired memory value, wherein the sneak current measurement is measured by the read controller while reading the stored memory value.

16. A non-transitory machine readable medium storing instructions that, when executed by a processor of a write controller, cause the processor to:

receive an address of a target memory element in a cross-point array and a desired memory value for the target memory element;

calculate a preliminary write strength based on the desired memory value;

receive a sneak current measurement for the target memory element;

identify a resistance related to the address;

determine a first write strength based on the preliminary write strength adjusted to compensate for an IR voltage drop of the cross-point array that affects a voltage applied to the target memory element, the IR voltage drop being a function of the resistance and the sneak current measurement; and apply the first write strength to the target memory element.

17. The non-transitory machine readable medium of claim 16, wherein the instructions cause the processor to utilize a lookup table or a write strength equation to determine the first write strength.

18. The non-transitory machine readable medium of claim 17, wherein the write strength equation calculates a voltage amplitude for the first write strength as the sum of a target voltage and an offset, the offset being the resistance multiplied by the sum of the sneak current measurement and a target current, and the target voltage and the target current relate to an ideal theoretical bias for setting the target memory element to the desired memory value.

19. The non-transitory machine readable medium of claim 16, wherein the instructions cause the processor to determine the first write strength by adjusting a parameter of the preliminary write strength to compensate for the IR voltage drop, the parameter including a voltage amplitude or a pulse duration.

20. The non-transitory machine readable medium of claim 16, wherein the instructions cause the processor to:

check a stored memory value at the target memory element after the write controller applies the first write strength; and apply a more aggressive write strength to the target memory element if the stored memory value is not equal to the desired memory value.

* * * * *